United States Patent [19]

Honda

[11] Patent Number: 5,377,213
[45] Date of Patent: Dec. 27, 1994

[54] LASER DRIVING CIRCUIT

[75] Inventor: Ryoji Honda, Saitama, Japan

[73] Assignee: Asahi Kogaku Kogyo Kabushiki Kaisha, Tokyo, Japan

[21] Appl. No.: 173,957

[22] Filed: Dec. 28, 1993

Related U.S. Application Data

[63] Continuation of Ser. No. 22,518, Feb. 25, 1993, abandoned.

[30] Foreign Application Priority Data

Feb. 26, 1992 [JP] Japan ............... 4-017318[U]

[51] Int. Cl.⁵ .................................. H01S 3/00
[52] U.S. Cl. ............................ 372/38; 372/29; 372/26; 372/25; 372/31
[58] Field of Search ............. 372/38, 29, 26, 25, 372/31

[56] References Cited

U.S. PATENT DOCUMENTS

| | | | |
|---|---|---|---|
| 4,704,677 | 11/1987 | Nagashima et al. | 364/183 |
| 4,744,087 | 5/1988 | Nicia | 372/38 |
| 4,748,633 | 5/1988 | Negishi | 372/38 |
| 4,757,508 | 7/1988 | Zimmerman | 372/26 |
| 4,761,659 | 8/1988 | Negishi | 346/108 |
| 4,878,225 | 10/1989 | Aiba et al. | 372/38 |
| 5,050,177 | 9/1991 | Ema | 372/38 |
| 5,119,360 | 6/1992 | Minakuchi | 369/116 |
| 5,153,871 | 10/1992 | Minakuchi | 369/116 |

Primary Examiner—Georgia Y. Epps
Attorney, Agent, or Firm—Sandler, Greenblum & Bernstein

[57] ABSTRACT

A laser driving circuit that controls an intensity of a laser beam emitted by a laser diode to become a predetermined destination value. The predetermined destination value is shifted to a lower value when at least one of a plurality of predetermined signals is not inputted to the laser driving circuit. The lower value is shifted to the predetermined destination value a predetermined period after all of the predetermined signals have been inputted to the laser driving circuit.

33 Claims, 3 Drawing Sheets

LASER DRIVING CIRCUIT

This application is a continuation of application Ser. No. 08/022,518, filed Feb. 25, 1993, now abandoned.

BACKGROUND OF THE INVENTION

The present invention relates to a laser driving circuit utilizing a laser diode, and more specifically, to a laser driving circuit wherein the intensity of the laser beam emitted by the laser diode is regulated.

Conventionally, a laser diode, or a semiconductor laser is utilized as a laser emitting means in a laser beam printer and the like. In such a printer, for example, the laser diode is controlled such that the intensity of the laser beam is regulated to become a predetermined intensity.

In order to control the intensity of the laser beam as above, the laser driving circuit generally has a so-called APC (Automatic Power Control) function.

The laser drive circuit employed, for example, the laser beam printer is driven as follows:

At first, power (voltage) is supplied to the laser drive circuit. At this stage, the laser diode does not emit laser beam. After the power (voltage) has supplied in steady state, a print enable signal is transmitted from a host computer, or the like, to actuate the laser diode to emit the laser beam.

In order to avoid a so-called rush current, in the conventional laser driving circuit, the power should be supplied to the circuit, then followed by the enable signal. Upon receipt of the enable signal, the circuit controls the current flow through the laser diode to emit laser beam. If the rush current flows in the laser diode, the laser diode may deteriorate, or worse, the laser diode may be broken. Thus, the order of supplying power to the circuit, and inputting the print enable signal should be maintained. If this order is not kept, the circuit may fall to control the current flow in the laser diode, and the rush current may result.

The laser beam printer, for example, is usually connected with an external device, such as a hose computer, and is used as an auxiliary device for printing data transmitted from the host computer. Under a situation that power has been supplied to the printer, i.e., to the laser driving circuit, and the print enable signal has also been issued, if the power supply is temporarily turned OFF and then it is turned ON again, the circuit may fail to subside the abrupt current flow in the laser diode since the print enable signal has been kept from being issued.

SUMMARY OF THE INVENTION

It is therefore an object of the present invention to provide an improved laser driving circuit which is capable of preventing the rush current through the laser diode regardless of the order of the power supply to the laser driving circuit and a signal instructing the emission of the laser beam.

For the above object, according to the present invention, there is provided a laser driving circuit for controlling electrical current flowing through a laser diode in accordance with the intensity of the laser beam emitted by the laser diode so that the current flow reaches a predetermined destination value, the laser driving circuit comprising:

means for receiving a plurality of predetermined signals;

means for shifting the predetermined destination value to a lower value when at least one of the plurality of predetermined signals is not received by the receiving means, the shifting means shifting the destination value from the lower value to the predetermined destination value after all of the plurality of predetermined signals have been received by the receiving means.

Optionally, the shifting means keeps the destination value to the predetermined destination value for a predetermined period even if all of the plurality of predetermined signals have been received by the receiving means.

Further optionally, the shifting means gradually shifts the destination value from the lower value to the predetermined destination value.

According to another aspect of the invention, there is provided a laser driving circuit for controlling a laser diode to emit laser beam, comprising:

means for supplying electricity to the laser driving circuit;

means for detecting an intensity of the laser beam emitted by the laser diode;

a circuit for controlling an electrical current flowing through the laser diode in accordance with the detected intensity of the laser beam so that the current flow reaches a predetermined destination value;

means for determining whether electricity is supplied to the laser driving circuit and for determining whether an instruction signal instructing a turning ON of the laser diode is inputted to the laser driving circuit;

means for shifting the predetermined destination value, the shifting means lowering the predetermined destination value when it is determined that at least one of the electricity or the instruction signal is not supplied to the laser driving circuit, while the shifting means shifts the lowered destination value to the predetermined destination value after a predetermined period is passes after both the said electricity and the instruction signal are inputted to the laser driving circuit.

According to a further aspect of the invention, there is provided a laser driving circuit for controlling a laser diode to emit a laser beam, the laser driving circuit comprising:

a variable current source for causing an electrical current to flow through the laser diode, the variable current source having a control terminal, an amplitude of the electrical current being varied in accordance with the voltage applied to the terminal;

a photodiode for generating a second electrical current in accordance with an intensity of the laser beam emitted by said laser diode;

an inverse peak hold circuit having an input terminal and an output terminal, the input terminal being connected in series with the photodiode, the output terminal being connected to the control terminal of the variable current source;

a pull down resistor connected to the input terminal of the inverse peak hold circuit;

means for receiving a plurality of predetermined signals; and means for shifting the voltage applied to the control terminal to a lower value when at least one of the plurality of predetermined signals is not inputted to the laser driving circuit, the shifting means shifting the voltage from the lower value to a predetermined value after all of the plurality of predetermined signals have been received by the receiving means.

DESCRIPTION OF THE ACCOMPANYING DRAWINGS

FIG. 1 shows a laser driving circuit embodying the present invention;

FIGS. 2(A)–2(G) are timing charts illustrating a periodical relationship of a voltage and/or current at various points in the laser driving circuit shown in FIG. 1;

DESCRIPTION OF THE EMBODIMENTS

Figure 1:
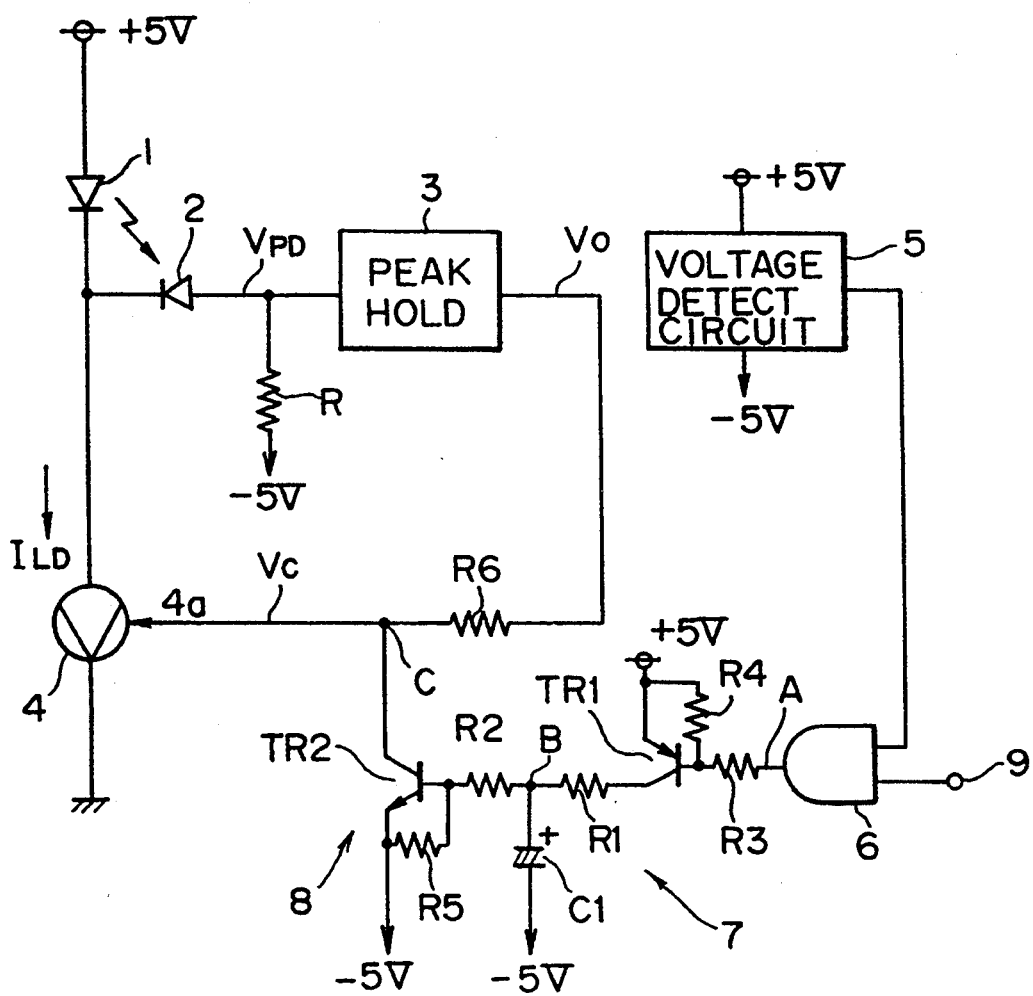

FIG. 1 shows a laser driving circuit embodying the present invention. The laser driving circuit in the figure has an APC (Automatic Power Control) function. The laser driving circuit is provided with a laser diode 1 for emitting a laser beam, a photodiode 2 for detecting the intensity of the laser beam emitted by the laser diode 1, an inverse peak-hold circuit 3 which will be described later, and a variable current source 4. In the laser driving circuit, there is further provided a pull-down resistance R, and a voltage supply circuit (not shown) for applying a predetermined voltage to the laser driving circuit.

In the laser driving circuit, further provided are a voltage detector 5 for detecting whether the supplied voltage supply is stable, and a gate circuit 6 which outputs a predetermined signal when an enable signal 9 instructing the emission of the laser beam is inputted while the voltage is being applied to the laser driving circuit. Further, in the laser driving circuit, a delay circuit 7 for delaying the rise-up of the signal outputted from the gate circuit 6 by a predetermined period, and a shifting circuit 8 for shifting the voltage at the control terminal of the variable current source 4.

The APC function works as follows: In this explanation of the APC function, in order to clarify the APC function of the embodiment, the effects of the shifting circuit 8 will be ignored.

First, the photodiode 2 generates current in accordance with the intensity of the laser beam emitted by the laser diode 1. When the laser diode 1 does not emit laser beam, since a pull down resistor R is connected with the input terminal of the inverse peak-hold circuit 3, the voltage applied to the inverse peak-hold circuit 3 is −5 volts. In this case, since the inverse peak-hold circuit 3 outputs its maximum voltage, Vo becomes its possibly highest value when the shifting circuit 8 is ignored. Accordingly, voltage Vc applied to the control terminal 4a of the variable current source 4 becomes its possibly largest value. The variable current source generates an electrical current flow that is in proportion to the applied voltage (positive voltage), and accordingly, a relatively large amount of current flows through the laser diode 1.

Second, since a relatively large amount of current flows through the laser diode 1, the laser diode 1 emits a relatively strong laser beam. Thus, a relatively large ammount of current flows through the photodiode 2.

This increases voltage $V_{PD}$ applied to the peak-hold circuit 3. As a result, since the peak-hold circuit 3 is an inverse-type circuit, output Vo of the peak-hold circuit 3 decreases, thereby decreasing the current generated by the variable current source 4.

A similar process generating of the electrical current will be followed thereafter.

The amplitude of the current generated by the variable current source 4 oscillates as described above, and then concentrates toward a predetermined destination value. In other words, the amplitude of the current is regulated to a predetermined destination value within a certain response period.

The voltage detector 5 outputs a "H" (high) level signal when the voltages applied by the positive and negative voltage sources, respectively, reach predetermined values, indicating a stable state. The enable signal 9 becomes a "H" (high) level when the laser diode is to be actuated (when the laser beam is required to be emitted).

Gate circuit 6 is an AND gate having two input ports for receiving the output of the voltage detector 5 and the enable signal 9, respectively. The gate circuit 6 outputs a "H" (high) level signal only when the voltage detector 5 outputs the "H" (high) signal and the enable signal 9 becomes the "H" (high) level.

Figure 5:
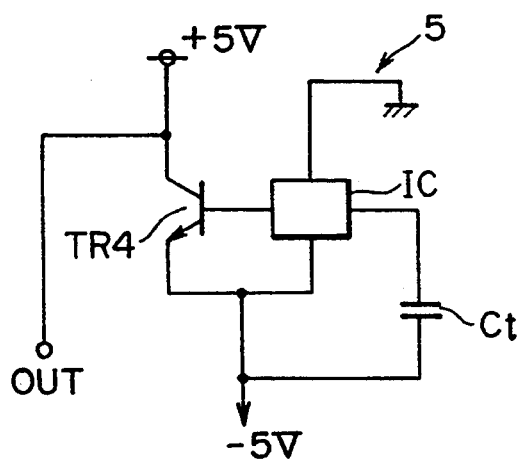
FIG. 5 shows an example of a voltage detector.

FIG. 5 shows an example of a voltage detector. This voltage detector 5 is a reset circuit wherein a transistor TR4 for detecting the negative voltage is connected with a reset IC (Integrated Circuit). The reset IC is connected with a condenser Ct. When the voltages are applied to the laser driving circuit, by charging the condenser Ct, the voltage detector waits for the voltages to stabilize. Then, the voltage detector is reset and outputs the "H" level signal (+5 volts) as a voltage detection signal.

Since the voltage detector 5 is provided with the reset IC, if the supplied voltage is not stable and lowered, the voltage detector 5 is reset and outputs a "L" (low) signal. Thereafter, if the supplied voltage becomes the predetermined value, the voltage detector 5 outputs the "H" signal again.

It is further possible to construct the voltage detector 5 to output an "L" signal when, for example, an openable cover of the printer (if it is provided) is opened. Constructed as above, it becomes possible to prevent the laser diode from erroneously or unintendedly emitting the laser beam.

Figure 6:
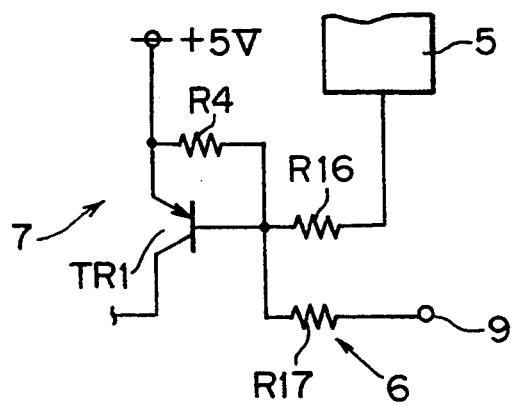
FIG. 6 shows an example of a gate circuit.

FIG. 6 shows an example of the gate circuit 6. In this gate circuit 6, resistors R16 and R17 are respectively connected between the base of PNP transistor TR1, and the voltage detector and the input terminal of the enable signal 9. The gate circuit 6 outputs the AND signal in accordance with the voltage fall through the resistors R16, R17, and R4 which is connected between the base and emitter of transistor TR1.

The delay circuit 7 is constructed such that the collector and the emitter of PNP transistor TR1, and a resistor R1, and a condenser C1 is connected in series. Point B, where the condenser C1 and the resistor R1 are connected, is connected with the shifting circuit 8 through a resistor R2. A base of the PNP transistor TR1 is connected with the gate circuit 6 through a resistor R3, and further connected with the emitter of the transistor TR1 through a resistor R4. The other end of resistor R3 is connected with output terminal A of the gate circuit 6. Note that the response speed of the delay circuit 7 should be set slower than that of the APC function of the laser driving circuit.

The shifting circuit 8 is constructed such that the collector and emitter of NPN transistor TR2 is connected between a control terminal 4a of the variable current source 4 and the negative voltage source, the base of NPN transistor TR2 is connected with resistance R2, and the base of transistor TR2 is further connected with the emitter through resistor R5. Between the inverse peak-hold circuit 3 and the variable current source 4, there is provided a resistance R6 for limiting the electrical current passing therethrough.

Figure 2:
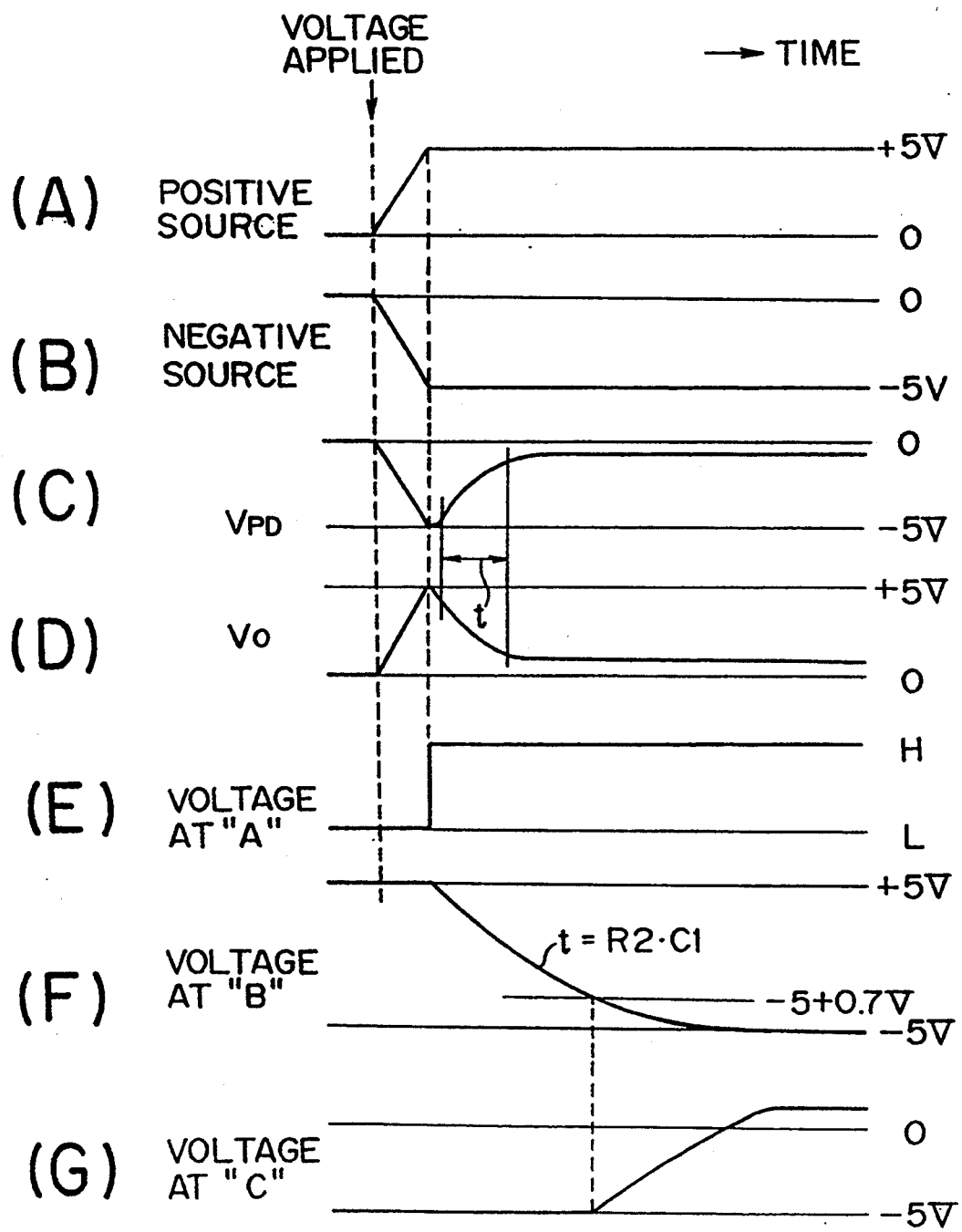

FIG. 2 is a timing chart illustrating the periodical relationship of the voltage and/or current at various points of the laser driving circuit shown in FIG. 1. When the driving circuit is turned OFF, or when the enable signal 9 is in the low state even if the driving circuit is turned ON, the "L" (low) signal is applied to the base of transistor TR1. Thus, PNP transistor TR1 is in its "ON" state, and condenser C1 is charged. With this condition, voltage at the point B (at the point where the condenser C1 and the resistor R1 is connected) is "H" (high), thereby NPN transistor TR2 becomes in its "ON" state. Thus, at point C, i.e., the control terminal 4a of the variable current source 4, is connected with the negative voltage source through NPN transistor TR2 so as to keep the voltage Ve on point C at a negative value ($-5$ volts).

Under the above-described situation, if the positive voltage ($+5$ volts) and the negative voltage ($-5$ volts) are applied to the laser driving circuit as shown in FIGS. 2(A) and 2(B), the output voltage $V9_{PD}$ of the photo diode 2, i.e., the input voltage of the inverse peak-hold circuit 3 becomes $-5$ volts as shown in FIG. 2(C).

In the laser driving circuit of FIG. 1, the current source is controlled in accordance with the output voltage of the peak-hold circuit. Therefore, if the input voltage of the inverse peak-hold circuit falls down to $-5$ volts, the output voltage of the inverse peak-hold circuit becomes $+5$ volts high as indicated in FIG. 2(D). Thus, if the shifting circuit 8 is not provided, the current flow generated by the variable current source becomes too great, which result in the rush current.

In order to avoid the situation described above, in the present embodiment, control terminal 4a of the variable current source 4 is kept at $-5$ volts as shown in FIG. 2(G). Thus, the variable current source 4 generates the minimum current flow. Accordingly, the glow of the rush current in the laser diode 1 can be prevented.

When the supplied positive and negative voltages have stabilized to the respective terminals of the laser driving circuit, the voltage detector 5 outputs the "H" (high) signal. At this stage, if printing is instructed, i.e., if the enable signal 9 is a "H" (high) level, the gate circuit 6 outputs the "H" (high) level signal, as shown in FIG. 2(E). The signal outputted by the gate circuit 6 is inputted into the delay circuit 7. In the delay circuit 7, as the "H" signal is inputted, PNP transistor TR1, which has been turned ON, is turned OFF. Thus, condenser C1 is discharged, so that the voltage at point B gradually decreases from $+5$ volts to $-5$ volts in accordance with the time constant value determined by the condenser C1 and the resistor R2.

As shown in FIG. 1, voltage at point B is applied to base of the NPN transistor TR2 of the shifting circuit 8. When the voltage on point B reaches the threshold value for turning ON/OFF transistor TR2 ($-5+0.7$ volts; the base-emitter voltage is 0.7 volts), voltage Vc starts increasing, as shown in FIGS. 2F and 2G, respectively. As the voltage applied to NPN transistor TR2 decreases gradually after it becomes $-5+0.7$ volts, voltage Vc at the control terminal 4a (point C) gradually increases, as shown in FIG. 2G. In the embodiment, the speed of the voltage increase at the control terminal 4a is made relatively slow. That is, after the laser driving circuit has been turned ON, and the APC circuit has reached in the stable condition where it outputs the control voltage control under the steady state and can control the variable current source to output the appropriate current flow, control of the control voltage by the NPN transistor TR2 at the control terminal 4a is released, and the normal APC is effected. Thus, the rush current flow in the laser diode can be prevented.

In the foregoing descriptions, it is assumed that the turning ON of the laser driving circuit and the input of the enable signal occur substantially at the same time. However, the present invention can be applied in the case where the power has been turned ON and the input of the enable signal follows, or in the case where the enable signal 9 is applied first and driving circuit is turned ON thereafter. In other words, NPN transistor TR2 of the shifting circuit 8 is in the ON state until the gate circuit 6 outputs the "H" signal. Thus the transistor TR2 keeps the voltage at the control voltage terminal 4a to the negative value, so that the electrical current flowing in the laser diode is kept to its minimum amount.

In such a case, according to the present invention, if both the enable signal and the voltage detection signal are inputted, NPN transistor TR2 is gradually turned down and turned OFF. Thus, the control voltage Vc applied to the control terminal 4a is firstly controlled by transistor TR2, then controlled with the APC function after the control voltage Vc has become in the steady state. Therefore, the rush current is effectively prevented from flowing in the laser diode.

Figure 3:
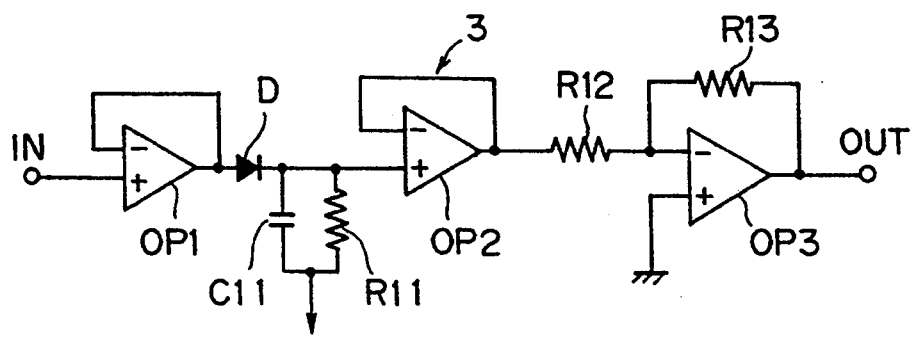
FIG. 3 shows an example of an inverse peak-hold circuit.

FIG. 3 shows an example of an inverse peak-hold circuit. In this example, the circuit is provided with three operational amplifiers OP1, OP2 and OP3, a diode D, resistors R11, R12 and R13, and a condenser C11.

Figure 4:
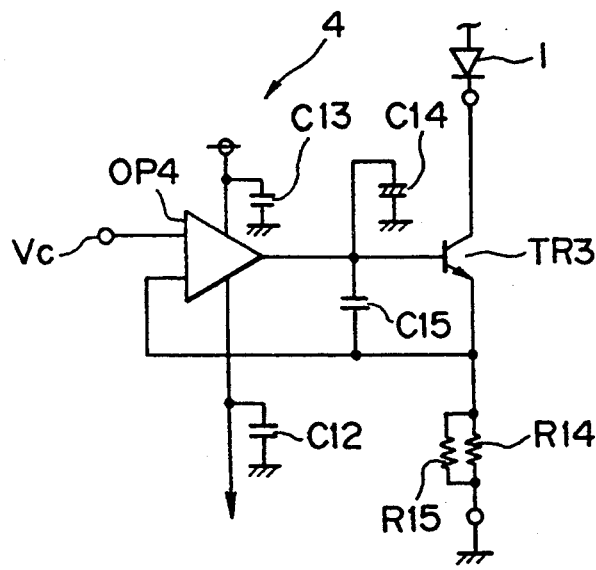
FIG. 4 shows an example of a variable current source.

FIG. 4 shows an example of a variable current source. The variable current source includes an operational amplifier OP4, an NPN transistor TR3, resistors R14 and R15, and condensers C12, C13, C14 and C15.

In the embodiments, the laser driving circuit is controlled to avoid the rush current when the driving circuit is turned ON and then the enable signal is inputted. However, it is possible to construct the driving circuit to be actuated only when the driving circuit is turned ON. In such a construction, the gate circuit 6 for outputting the AND signal can be omitted.

Further, the shifting circuit 8 can be constructed to change its operation state stepwisely in accordance with the voltage outputted by the delay circuit 7.

As described above, according to the present invention, when the laser driving circuit is turned ON, the control voltage of the variable current source remains at a predetermined lower value, and after a predetermined period of time has passed, i.e., after the APC has reached its steady state, the output voltage from the APC is applied as the control voltage of the variable currents source. Thus, the rush current which would flow through the laser diode can be effectively prevented, even if the power supply to the laser driving circuit is turned OFF during the time that the enable signal is kept ON, so that a deterioration and/or failure of the laser diode is avoided.

The present disclosure relates to subject matter contained in Japanese Utility Model Application No. HEI 4-17318, filed on Feb. 26, 1992, which is expressly incorporated herein by reference in its entirety.

What is claimed is:

1. A laser driving circuit for controlling electrical current flowing through a laser diode in accordance with an intensity of a laser beam emitted by said laser diode, said laser driving circuit comprising:
   means for receiving a plurality of predetermined signals;
   means for supplying electrical current to said laser diode; and
   means for gradually shifting an amplitude of said electrical current supplied by said supplying means to a predetermined destination value a predetermined period of time after all of said plurality of predetermined signals have been received by said receiving means.

2. The laser driving circuit according to claim 1, wherein said shifting means comprises detection means for detecting whether all of said plurality of signals have been received.

3. The laser driving circuit according to claim 2, wherein said detection means comprises an AND gate circuit.

4. The laser driving circuit of claim 1, wherein said amplitude of said electrical current increases to said predetermined destination value without exceeding said predetermined destination value.

5. The laser driving circuit of claim 1, said shifting means further comprising means for reducing said amplitude of said electrical current to a value lower than said destination value when at least one of said plurality of predetermined signals is not received by said receiving means.

6. The laser driving circuit according to claim 5, wherein said shifting means maintains said amplitude of said electrical current at said lower value for a predetermined period of time even if all of said plurality of predetermined signals have been received by said receiving means.

7. The laser driving device according to claim 5, wherein said shifting means gradually shifts said amplitude of said electrical current from said lower value to said predetermined destination value.

8. The laser driving circuit of claim 1, wherein said means for gradually shifting comprises a delay circuit that delays said shifting of said amplitude of said electrical current.

9. The laser driving circuit of claim 8, wherein said delay circuit has a response speed slower than a response speed of said supplying means.

10. The laser driving circuit of claim 8, wherein said shifting means stepwisely changes said amplitude of said electrical current in accordance with said voltage outputted by said delay circuit.

11. The laser driving circuit of claim 8, wherein said delay circuit comprises a resistor and a capacitor that form an RC circuit that operates to gradually lower said amplitude of said electrical current to said predetermined destination value in accordance with a time constant value of said RC circuit.

12. The laser driving circuit of claim 8, wherein said shifting means comprises a transistor located between said electrical current supplying means and said delay circuit, said transistor controlling said electrical current supplying means in such a manner that said electrical current supplying means increases said amplitude of said electrical current to said predetermined destination value as an output voltage of said delay circuit decreases.

13. A laser driving circuit for controlling a laser diode to emit a laser beam, comprising:
   means for supplying an electrical current to said laser diode;
   means for detecting an intensity of said laser beam emitted by said laser diode;
   a circuit for controlling an amplitude of said electrical current to said laser diode in accordance with said detected intensity of said laser beam so that said amplitude of said electrical current reaches a predetermined destination value;
   means for determining whether said electrical current is supplied to said laser driving circuit and for determining whether an instruction signal instructing a turning ON of said laser diode is inputted to said laser driving circuit; and
   means for gradually shifting said amplitude of said electrical current to said predetermined destination value a predetermined period of time after both said electrical current and said instruction signal are inputted to said laser driving circuit.

14. A laser driving circuit according to claim 13, wherein said shifting means maintains said amplitude of said electrical current at a value lower than said predetermined destination value for a predetermined period even if both said electrical current and said instruction signal have been inputted to said laser driving circuit.

15. The laser driving circuit of claim 13, wherein said amplitude of said electrical current flow increases to said predetermined destination value without exceeding said predetermined destination value.

16. The laser driving circuit of claim 13, said shifting means further comprising means for reducing said amplitude of said electrical current to a value lower than said predetermined destination value when said instruction signal is not input to said laser driving circuit.

17. The laser driving circuit according to claim 16, wherein said shifting means gradually shifts said amplitude of said electrical current from said lower value to said predetermined destination value.

18. The laser driving circuit of claim 13, wherein said means for gradually shifting comprises means for delaying said shifting of said amplitude of said electrical current.

19. The laser driving circuit of claim 18, wherein said delaying means has a response speed slower than a response speed of said supplying means.

20. The laser driving circuit of claim 19, wherein said shifting means stepwisely changes said amplitude of said electrical current in accordance with said voltage outputted by said delaying means.

21. The laser driving circuit of claim 18, wherein said delaying means comprises a resistor and a capacitor that form an RC circuit that operates to gradually lower said amplitude of said electrical current to said predetermined destination value in accordance with a time constant value of said RC circuit.

22. A laser driving circuit for controlling a laser diode to emit a laser beam, said laser driving circuit comprising:
   a variable current source for supplying an electrical current to said laser diode, said variable current source having a control terminal, an amplitude of said electrical current being varied in accordance with a voltage applied to said control terminal;

a photodiode for generating an electrical current in accordance with an intensity of said laser beam emitted by said laser diode;

an inverse peak hold circuit having an input terminal and an output terminal, said input terminal being connected in series with said photodiode, said output terminal being connected with said control terminal of said variable current source;

a pull down resistor connected to said input terminal of said inverse peak hold circuit;

means for receiving a plurality of predetermined signals; and means for shifting said voltage applied to said control terminal to cause said amplitude of said electrical current to gradually increase to a predetermined destination value a predetermined period of time after all of said plurality of predetermined signals have been received by said receiving means.

23. The laser driving circuit according to claim 22, wherein said shifting means keeps said voltage applied to said control terminal to said predetermined destination value for a predetermined period even if all of said plurality of predetermined signals have been received by said receiving means.

24. The laser driving circuit of claim 22, wherein said amplitude of said predetermined destination value increases to said predetermined destination value without exceeding said predetermined destination value.

25. The laser driving circuit of claim 22, said shifting means further comprising means for lowering said amplitude of said electrical current to a value lower than said predetermined destination value when at least one of said predetermined signals is not inputted to said laser driving circuit.

26. The laser driving circuit of claim 22, wherein said means for shifting comprises means for delaying said shifting of said amplitude of said electrical current.

27. The laser driving circuit of claim 26, wherein said shifting means stepwisely changes said amplitude of said electrical current in accordance with said voltage outputted by said delaying means.

28. The laser driving circuit of claim 26, wherein said delaying means comprises a resistor and a capacitor that from an RC circuit that operates to said amplitude of said electrical current to said predetermined destination value in accordance with a time constant value of said RC circuit.

29. A laser driving circuit for controlling an electrical current flowing through a laser diode in accordance with an intensity of a laser beam emitted by said laser diode, said laser driving circuit comprising:

a receiver that receives a plurality of control signals;

a variable current source that supplies electrical current to said laser diode; and a controller that controls said variable current source to start supplying said electrical current to said laser diode a predetermined period of time after said control signals are received by said receiver, such that an amplitude of said electrical current is gradually increased to a destination value.

30. The laser driving circuit of claim 29, further comprising means for determining whether all of said plurality of control signals are received by said receiver.

31. The laser driving circuit of claim 29, wherein said controller increases said amplitude of said electrical current to said destination value without exceeding said destination value.

32. The laser driving circuit of claim 29, said controller further comprising means for lowering said amplitude of said electrical current to a value lower than said destination value when at least one of said plurality of control signals is not received by said receiver.

33. A laser driving circuit, comprising:

a receiver that receives a control signal; and a controller that controls an electrical current supplied to a laser diode, said controller gradually increasing an amplitude of said electrical current supplied to said laser diode to a predetermined destination value a predetermined period of time after said control signal is received by said receiver means.

* * * * *

UNITED STATES PATENT AND TRADEMARK OFFICE
CERTIFICATE OF CORRECTION

PATENT NO. : 5,377,213
DATED      : December 27, 1994
INVENTOR(S) : Ryoji HONDA

It is certified that error appears in the above-indentified patent and that said Letters Patent is hereby corrected as shown below:

At column 10, line 5 (claim 28, line 3), change "from" to ---form---.

Signed and Sealed this

Eleventh Day of July, 1995

Attest:

BRUCE LEHMAN

Attesting Officer    Commissioner of Patents and Trademarks